United States Patent
Weeman

(10) Patent No.: US 11,971,434 B2
(45) Date of Patent: Apr. 30, 2024

(54) POWER SOURCE WITH ERROR DETECTION

(71) Applicant: Keithley Instruments, LLC, Solon, OH (US)

(72) Inventor: William C. Weeman, Aurora, OH (US)

(73) Assignee: Keithley Instruments, LLC, Solon, OH (US)

( * ) Notice: Subject to any disclaimer, the term of this patent is extended or adjusted under 35 U.S.C. 154(b) by 0 days.

(21) Appl. No.: 17/245,874

(22) Filed: Apr. 30, 2021

(65) Prior Publication Data

US 2022/0350352 A1 Nov. 3, 2022

(51) Int. Cl.
*G01R 19/00* (2006.01)
*G01R 15/16* (2006.01)
*G01R 19/10* (2006.01)

(52) U.S. Cl.
CPC ............ *G01R 19/10* (2013.01); *G01R 15/16* (2013.01)

(58) Field of Classification Search
CPC ................................ G01R 19/10; G01R 15/16
See application file for complete search history.

(56) References Cited

U.S. PATENT DOCUMENTS

| | | | | |
|---|---|---|---|---|
| 6,504,395 B1* | 1/2003 | Johnson | ........... | G01R 31/31721 324/750.02 |
| 7,307,485 B1* | 12/2007 | Snyder | ..................... | H03K 5/26 331/150 |
| 2014/0152335 A1* | 6/2014 | Vulovic | ................. | G01R 31/54 324/754.05 |
| 2015/0145524 A1* | 5/2015 | Duncan | .............. | G01R 31/3167 324/538 |
| 2021/0063474 A1* | 3/2021 | Messier | ............. | G01R 31/2839 |
| 2021/0132143 A1* | 5/2021 | Messier | ........... | G01R 31/31924 |
| 2022/0229109 A1* | 7/2022 | Tseng | ................. | G01R 31/3172 |

* cited by examiner

*Primary Examiner* — Dominic E Hawkins

(74) *Attorney, Agent, or Firm* — Miller Nash LLP; Andrew J. Harrington

(57) ABSTRACT

A voltage source device, including a first voltage source configured to output a first voltage, source pathways to connect the first voltage source to a device under test, sensing pathways electrically coupled to the device under test; and circuitry configured to sample a second voltage at the device under test, determine a voltage difference between the first voltage and the second voltage, and adjust the first voltage based on the difference between the first voltage and the second voltage.

18 Claims, 3 Drawing Sheets

POWER SOURCE WITH ERROR DETECTION

TECHNICAL FIELD

This disclosure is directed to systems and methods related to power sources, and in particular, to accurately adjusting a power source based on a sensed voltage at a device under test.

BACKGROUND

Some power source units use four-terminal sensing correction, also known as Kelvin sense correction, to sense voltage at or near a device under test (DUT) attached to the power source unit to correct for voltage drops in the pathways and connections of the source pathways leading to the DUT. Kelvin sense correction can help ensure that a voltage sourced accurately reflects the voltage that is present on the DUT.

While the conventional Kelvin sensing can allow for very accurate detection of the voltage at the DUT, it can be problematic when used as a correction of the source voltage by potentially causing the control loop to become less stable, or even unstable. Some instruments have addressed this issue by employing an electrical short at the DUT connection in order to correct the sensing of the voltage at the DUT. A known electrical current is driven through the pathways, and the voltage drop can be measured to generate a compensation factor that is used when generating the source voltage to help ensure that the voltage at the DUT is at the intended voltage level. However, using the electrical short requires interrupting testing and creating the electrical short any time it is desired to update or check the compensation to ensure the electrical short is set properly.

Examples of the disclosure address these and other deficiencies of the prior art.

BRIEF DESCRIPTION OF THE DRAWINGS

Aspects, features and advantages of examples of the present disclosure will become apparent from the following description of examples in reference to the appended drawings in which.

DESCRIPTION

Disclosed herein is an enhancement to a method of using Kelvin sense correcting for source devices, such as, but not limited to, source measure units, that alleviates a number of problems with the conventional Kelvin sense correcting methods and the circuit short correction discussed above.

Examples of the disclosure retain the sensing pathways, to allow for measurements of voltage to be taken remotely, and employ the sensing pathways to determine and correct the level of voltage drop in the source pathways and error in the source pathway, while not using the sensed voltage directly. This allows for creation of a control loop that is separate from the source loop, which has the benefits of speed and stability associated with local control. Examples of the disclosure can also allow for error and boundary checking to ensure that if a sense lead slips, breaks, or otherwise misses contact the source control loop does not open and result in potential damage to an attached load. Further, the voltage drop associated with the source pathways can be monitored to ensure desired error levels or specifications of source are maintained at the DUT or load.

Figure 1:
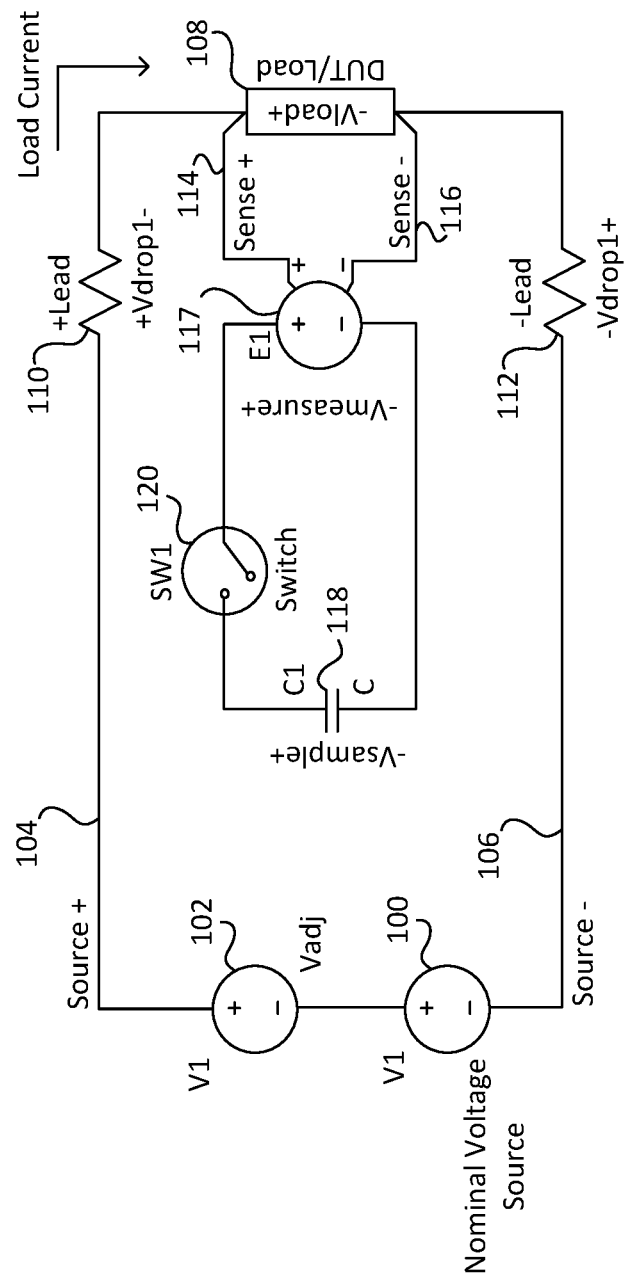
FIG. 1 is a simplified circuit diagram of a source device according to some examples of the disclosure.

FIG. 1 is a simplified circuit diagram of an example source according to some examples of the disclosure. As will be understood by one skilled in the art, additional components may be included within the circuit or source device that are not shown in FIG. 1. For example, additional hardware, such as comparators, analog-to-digital converters, processors, and other devices may be within the source to perform some of the functions discussed with respect to FIG. 1, as will be readily understood by one skilled in the art.

As illustrated in FIG. 1, a nominal voltage source 100 is electrically coupled to an adjustment voltage source 102. Although FIG. 1 shows the nominal voltage source 100 and the adjustment voltage source 102 as separate sources, as will be understood by one skilled in the art, the nominal voltage source 100 and the adjustment voltage source 102 could be combined into a single source in some examples. Source pathways 104 and 106 transmit the voltage from the sources 100 and 102 to the DUT 108. The source pathways 104 may include printed circuit board traces, switches, sensors, connectors, and/or pathways.

The source pathways 104 and 106 have resistance, which is illustrated as resistors 110 and 112. The resistors 110 and 112 are used to illustrate the resistance on the source pathways 104 and 106 and are not necessarily actual resistors in the source pathway. The resistance of the pathways 104 and 106 are determined by the length of the lead, the conductivity of the material, and the geometry of the conductor. Additionally, various circuit components such as sensors used to measure load current or other parameters, switches, and connectors may be included in the pathways and the resulting values for resistors 110 and 112. This resistance results in voltage drops so that the voltage received at the DUT 108 is not the same as the voltage output by the sources 100 and 102. Sensing pathways 114 and 116 are also connected to the DUT 108 and the sensed voltage can be represented as Vmeasure. The sensing pathways 114 and 116 can include other components, as will be understood by one skilled in the art. While a current sensor would generally not be included directly in the sensing pathways 114 and 116, as used herein, it will be understood by one skilled in the art that the phrase sensing pathways can encompass current sensors in some examples.

Vmeasure can be available for any measurement needs and can be output on a display of the source or any other type of display or other output to a user. A voltage generator 117 is illustrated in FIG. 1 for ease of illustration and discussion. The voltage generator 117 is, at most, generating a voltage based on the voltage received via the sense pathways 114 and 116. However, while illustrated as a voltage generator 117, the component 117 may be a buffer and/or gain/scaling circuit in some examples that can create a copy of the voltage across the DUT 108 from the sensing pathways 114 and 116 and is not actually generating a voltage Vmeasure. For example, a source unit may have a display which can output the voltage at the DUT for a user to view. Although not shown, as will be understood by one skilled in the art, Vmeasure may be sent to an analog-to-digital converter or any other devices as necessary to show or display the voltage across the DUT 108 on a display or send the voltage at the DUT 108 to any other device. The digitized Vmeasure value can also be received by a processor for further processing, as desired.

The amount of correction voltage output by the adjustment voltage source 102, or the main source if only one source is provided, can be controlled based on the voltage received at Vsample across the capacitor 118. At initial startup of the source unit, the adjustment voltage source 102 would be set to zero. A simple voltage detector can include a capacitor 118 and a switch 120. The time that Vsample, or the capacitor 118, is connected to Vmeasure can be controlled and minimized by switch 120. That is, rather than constantly monitoring and adjusting the source voltage, the introduction of switch 120 as a sample component can provide a means for filtering, limiting, and other corrections as part of Vsample to ensure that the adjustment voltage source 102 does not exceed an allowable limit or cause extra noise or errors to enter the source control loop. That is, Vsample may be measured and monitored at discrete or periodic time intervals, rather than continuously, and switch 120 can ensure that Vsample is only updated at times when Vsample is not also simultaneously being used to correct Vadj.

As an example, in an analog control loop as shown in FIG. 1, the adjustment voltage source 102 can be set to zero and the voltage source 100 controlled in such a way as to cause a known electrical current to flow through the load. With the known electrical current flowing, the voltage detector can cause the switch 120 to close to capture the voltage present on the DUT at the capacitor 118. This voltage, Vsample, can be compared to the voltage sourced at voltage source 100 and used to determine a rule such that the adjustment voltage, Vadj, would correct the error due to flowing electrical current. The voltage detector can include a comparator or any other device, such as a processor or analog-to-digital converter, to determine a difference voltage between Vsample and the voltage source 100. Assuming all transient effects are settled when the measurements are taken, Vadj can be calculated or determined by an adjustment voltage selector based on equation (1):

$$V_{adj} = I_{Load} * R_{comp} \quad (1)$$

Where $R_{comp}$ is calculated as shown in equation (2):

$$R_{comp} = \frac{V_{source} - V_{sample}}{I_{Load}} \quad (2)$$

Based on the values captured for $V_{source}$, $V_{sample}$, and $I_{Load}$ at the time of characterization.

In some examples, rather than the voltage detector including a sample and hold circuit, as illustrated by capacitor 118 and switch 120, a multiplying digital-to-analog converter could be used to store a code representing a value of the compensation resistance $R_{comp}$. The multiplying terminal of the multiplying digital-to-analog converter can be used to input a voltage representing the amount of electrical current flowing through the load. This example would have the benefit that there would be no concern about sample and hold circuit limitations impacting the effectiveness of the circuit over time. Further, updates to the value of $R_{comp}$ could be achieved by writing new values to the multiplying digital-to-analog converter. Multiplying digital-to-analog converter updates could be managed or limited such that the updates occur as necessary to keep the value of Vmeasure across the load within tolerances specified by the source.

In situations where the sampling or multiplying digital-to-analog converter updates happen very quickly, the control loop response of this circuit would begin to approach the performance of the conventional Kelvin source control loop. However, benefits can still be retained, such as limit correction discussed below with respect to FIG. 3.

Further, rather than calculating the value of $R_{comp}$, the adjustment voltage selector could include a processor to determine a digital-to-analog code necessary to get the desired adjustment voltage and limits could be directly applied to the range of the digital-to-analog codes allowed.

Figure 2:
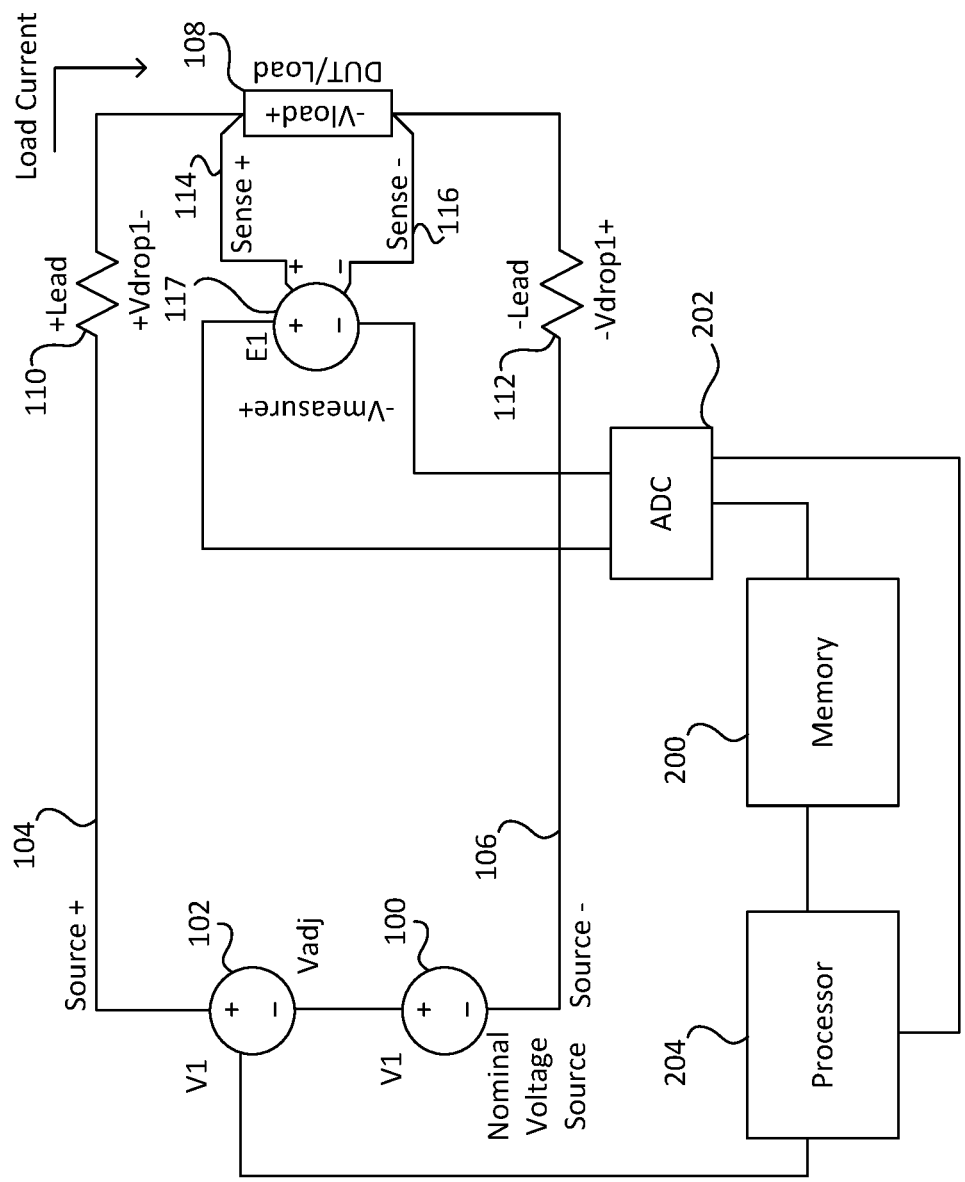
FIG. 2 is another simplified circuit diagram of a source device according to some examples of the disclosure.

Examples of the disclosure, however, are not limited to an analog control loop or a combination of an analog and digital control loop, and a digital control loop may be used in some examples. FIG. 2 illustrates an example diagram of a digital control loop according to some examples of the disclosure. However, as will be understood by one skilled in the art, other components may be included within the diagram of FIG. 2 that are not shown, such as, but not limited to, a display or user input, as well as various other hardware components.

In the example diagram of FIG. 2, those components that are the same as those discussed above with respect to FIG. 1 are given the same reference numbers and are not further discussed with respect to FIG. 2. Rather than a sample and hold circuit as illustrated in FIG. 1 as a capacitor 118 and switch 120, the sample component can include a digital control loop. The digital control loop may include a voltage detector having a memory 200, analog-to-digital converter 202, and a processor 204. The voltage detector can cause the Vmeasure value to be stored within a memory 200 once it has been converted to a digital value through the analog-to-digital converter 202. Vmeasure may be stored continuously in the memory 200 or a switch (not shown) may be provided to store Vmeasure at discrete time intervals in the memory 200.

Stored Vmeasure values may be used to calculate a stored $R_{comp}$ value and then dynamically calculate the proper Vadj value based on the known $I_{Load}$ electrical current in the processor 204. The processor can include an adjustment voltage selector that can output the desired Vadj value to be output by the adjustment voltage source 102. However, as mentioned above, a separate adjustment source 102 need not be provided in some examples and the adjustment voltage may be added to the output value of the nominal voltage source 100.

In any of the above examples, a threshold detector can be included that includes rules to monitor the difference between the value of Vmeasure that appears across the DUT 108 after compensation and the desired voltage source value. Based on the comparison of the difference between Vmeasure and the desired DUT 108 voltage source value, actions such as a user alert or a refresh of the calculation of $R_{comp}$, for example, can be taken.

Additionally, in some examples, the threshold detector may set limits to suppress the action of adjusting the voltage, if desired, to ensure that a condition such as a broken or missing sense lead would not result in creating a condition that could damage the DUT 108.

Figure 3:
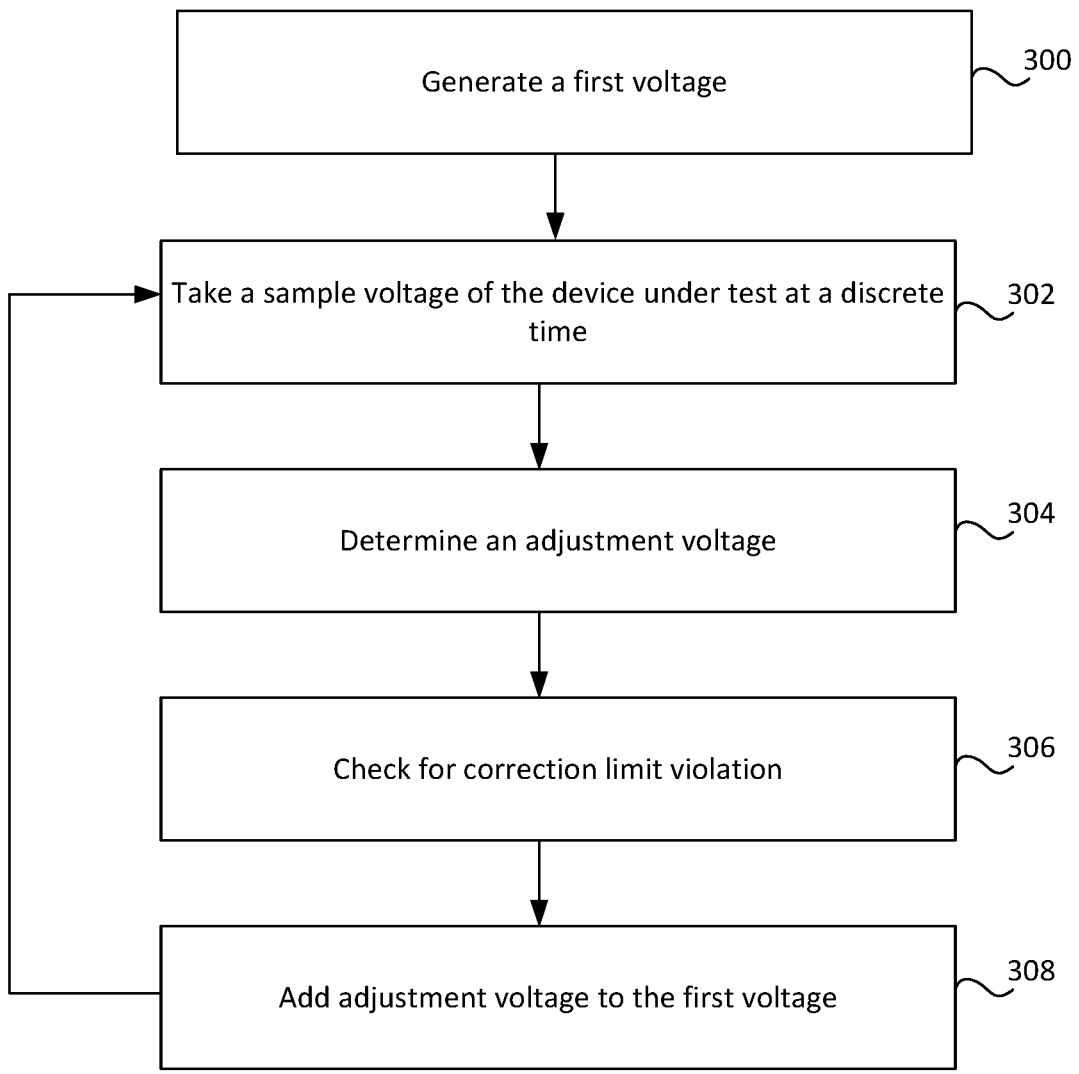
FIG. 3 is a flow chart illustrating various operations of the source devices of either FIG. 1 or 2.

FIG. 3 illustrates an example operation for controlling a voltage source based on a sensed voltage of a DUT 108 according to examples of the disclosure. In operation 300, a first voltage is generated and transmitted to a DUT 108 by the source pathways 104 and 106.

In operation 302, a voltage detector may take a sample voltage of the voltage at the DUT 108. For example, the sample voltage may be determined based on the sample and hold circuit shown in FIG. 1 or the memory and processor shown in FIG. 2. The sample voltage may only be taken periodically, rather than continuously, in some examples, such that the sample adjustment loop operates separately from the source loop. In some examples, the sample voltage may be determined while using a known current. If a known current is used, then Rcomp can be calculated, as discussed above.

In operation 304, an adjustment voltage selector can determine an adjustment voltage based on the sample voltage, as discussed in detail above with respect to FIGS. 1 and 2. For example, in some examples, the determined compensation resistance can be used with the actual current to determine an adjustment voltage. The adjustment voltage, however, can be determined in other ways as well, including comparing the voltage at Vmeasure to the desired source voltage value, and periodically adding an adjustment voltage to bring Vmeasure closer to the desired source voltage value.

In some examples, the adjustment voltage may be directly added to the first voltage, as shown in operation 308. However, in other examples, a threshold detector can be utilized to ensure that no correction limit violation has occurred, as illustrated in operation 306. A correction limit violation may occur, for example, if the difference between the first voltage and the sample voltage is greater than an allowed amount. If a correction limit violation has occurred, the source device may generate an output for a user to alert the user of the condition, or take some other action such as automatically preventing the out-of-limit correction from being used to adjust the source. In some examples, the alert may only be generated if the error is greater than a predetermined amount. For example, if the error is less than the predetermined amount, the source will not add an adjustment voltage, but will not alert a user. If the error is greater than the predetermined amount, however, the user is alerted to the condition.

Another example of a correction limitation may be to select maximum and/or minimum values that bound the range of values for the compensation resistance, $R_{comp}$, and/or the adjustment voltage, Vadj. As an example, in some embodiments, the value of Rcomp may be refreshed or updated and a correction violation may occur if the calculated value of $R_{comp}$ is less than zero or greater than two ohms. In another examples, either using Rcomp or not, if the adjustment voltage is greater than one volt then a correction violation may occur. Any number of correction limit parameters may be set, as either desired by a user or the instrument manufacturer. For example, in some embodiments, a user may configure within the source device the correction limit desired. In other examples, the correction limits are set during manufacturing of the device. It is also possible that a user is only allowed to configure limits within some bounds set during design or manufacturing of the source.

Further, although FIG. 3 illustrates operation 306 occurring after operation 304, in some examples, the correction limit violation can be checked in operation 306 before an adjustment voltage is determined in operation 304. If a violation has occurred, an alert can be generated and an adjustment voltage is not determined. If an adjustment voltage was not determined due to a violation, it is possible for an adjustment of zero (no adjustment) to be added to the first voltage, then the operation returns to operation 302 to check the sample voltage at another discrete or periodic time. The time can be set based on a schedule or may be initiated by a user or when a particular situation occurs.

Examples of the disclosure can allow accurate measurement of the voltage across the DUT 108 while also allowing for correction of a source by using the information from sensing pathways to provide periodic or discrete time corrections to the sourced valued. This can be done, as discussed above, so that the source loop operates separately from the sense loop, which can help prevent instability and noise under certain conditions.

Further, examples of the disclosure can allow for limit or error checking on the amount of adjustment applied to the source. Rather than sending the sensed voltage from the DUT 108 directly to the source to adjust, as discussed above with respect to the conventional systems, error checking can be performed so that an erroneously sensed voltage is not used to adjust the voltage amount and potentially damage a connected DUT 108. This can prevent problems in instances where the sense pathways are not properly connected, such as probe alignment problems, terminal mis-wiring, broken pathways, etc.

Examples of the disclosure also may allow for easier mode switching between local (two-wire) and remote (four-wire) sensing methods. The error correction limit of the examples of the disclosure can limit source errors, or other problems or glitches, which occur during the transition between local and remote sensing methods. Further, because any remote sense adjustments are realized by incorporating a distinct Vadj term rather than transitioning full control from local to remote sense points, the local sense case simply represents a special condition where Vadj or Rcomp is fixed or set based on known parameters within the instrument, or in some cases, may even be set to zero.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. A configuration of the technologies may include any one or more, and any combination of, the examples described below.

Example 1 a voltage source device, comprising a first voltage source configured to output a first voltage; source pathways to connect the first voltage source to a device under test; sensing pathways electrically coupled to the device under test; and circuitry configured to sample a second voltage at the device under test, determine a voltage difference between the first voltage and the second voltage, and adjust the first voltage based on the difference between the first voltage and the second voltage.

Example 2 is the voltage source device of example 1, wherein the circuitry includes a threshold detector configured to receive the voltage difference and compare the voltage difference to a correction limit; and an adjustment voltage selector configured to affect an adjustment voltage based on the voltage difference when the correction limit is not violated.

Example 3 is the voltage source device of example 2, wherein the correction limit is violated when the adjustment voltage violates one or more predetermined values.

Example 4 is the voltage source device of example 3, wherein the adjustment voltage violates the correction limit when the adjustment voltage is greater than a predetermined voltage.

Example 5 is the voltage source device of any one of examples 2, wherein the adjustment voltage selector is configured to select the adjustment voltage based on a load current and a resistance compensation value determined from a known electrical current through the device under test and the difference voltage.

Example 6 is the voltage source device of example 5, wherein establishing whether the difference violates the correction limit includes determining whether the resistance compensation violates one or more predetermined values.

Example 7 is the voltage source device of any one of examples 1-6, wherein the circuitry includes a voltage dector coupled to the sensing pathways to measure and/or scale a detected value of the second voltage; and a sample and hold component configured to capture and temporarily store the sampled second voltage.

Example 8 is the voltage source device of examples 1-7, wherein the circuitry is configured to capture and temporarily store the second voltage at discrete time intervals.

Example 9 is the voltage source device of examples 1-8 wherein the circuitry includes a switch configured to electrically couple a capacitor to the second voltage to sample the second voltage.

Example 10 is the voltage source device of any one of examples 1-9, wherein the circuitry includes an analog-to-digital converter configured to convert the sampled second voltage to a digital signal; a memory configured to store the digital signal representing the second voltage; and a processor.

Example 11 is the voltage source device of any one of examples 1-10, wherein the circuitry includes a multiplying digital-to-analog converter.

Example 12 is a method for correcting a source device based on a voltage at a device under test, comprising generating a first voltage; transmitting the first voltage to the device under test; sampling a second voltage at the device under test; determining a voltage difference between the first voltage and the stored second voltage; determining an adjustment voltage based on the voltage difference; and adjusting the first voltage based on the adjustment voltage.

Example 13 is the method of example 12, further comprising determining whether the adjustment voltage violates a correction limit; and adjusting the first voltage based on the adjustment voltage when the correction limit is not violated.

Example 14 is the method of example 13, wherein determining whether the adjustment voltage violates the correction limit includes determining whether the adjustment voltage violates one or more predetermined values.

Example 15 is the method of example 14, wherein the adjustment voltage violates the correction limit when the adjustment voltage is greater than a predetermined voltage.

Example 16 is the method of any one of examples 12-15, wherein the adjustment voltage is determined based on a load current and a resistance compensation value that is ascertained by an electrical current through the device under test and the difference voltage.

Example 17 is the method of any one of examples 12-16, wherein determining whether the adjustment voltage violates the correction limit includes determining whether the resistance compensation violates one or more predetermined values.

Example 18 is the method of any one of examples 12-17, wherein determining an adjustment voltage based on the second voltage by the correction component includes activating a switch to electrically couple a capacitor to the second voltage.

Example 19 is the method of any one of examples 12-18, further comprising converting the second voltage to a digital signal representing the second voltage; storing the digital signal representing the second voltage, and periodically determining the adjustment voltage based on the stored digital signal representing the second voltage.

Example 20 is the method any one of examples 12-19, further comprising temporarily storing the second voltage Example 21 is one or more computer-readable storage media comprising instructions, which, when executed by one or more processors of a source device, cause the source device to generate a first voltage; sample a second voltage at the device under test based on the first voltage; determine a voltage difference between the first voltage and the stored second voltage; determine an adjustment voltage based on the voltage difference; and adjust the first voltage based on the adjustment voltage.

Example 22 is the one or more computer-readable storage media of example 21, further including instructions that cause the source device to determine whether the adjustment voltage violates a correction limit; and adjust the first voltage based on the adjustment voltage when the correction limit is not violated.

Example 23 is the one or more computer-readable storage media of example 21, wherein determining whether the adjustment voltage violates the correction limit includes determining whether the adjustment voltage violates one or more predetermined values.

Example 24 is the one or more computer-readable storage media of any one of examples 21-23, wherein the adjustment voltage is determined based on a load current and a resistance compensation value that is ascertained by an electrical current through the device under test and the difference voltage.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that all features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

The invention claimed is:

1. A voltage source device, comprising:
a first voltage source configured to output a first voltage;
source pathways to connect the first voltage source to a device under test;
sensing pathways electrically coupled to the device under test; and
circuitry configured to sample a second voltage at the device under test, determine a voltage difference between the first voltage and the second voltage, and adjust the first voltage based on the difference between the first voltage and the second voltage, wherein the circuitry includes:
a threshold detector configured to receive the voltage difference and compare the voltage difference to a correction limit; and
an adjustment voltage selector configured to affect an adjustment voltage based on the voltage difference when the correction limit is not violated.

2. The voltage source device of claim 1, wherein the correction limit is violated when the adjustment voltage violates one or more predetermined values.

3. The voltage source device of claim 2, wherein the adjustment voltage violates the correction limit when the adjustment voltage is greater than a predetermined voltage.

4. The voltage source device of claim 1, wherein the adjustment voltage selector is configured to select the adjustment voltage based on a load current and a resistance compensation value determined from a known electrical current through the device under test and the voltage difference.

5. The voltage source device of claim 1, wherein establishing whether the voltage difference violates the correction limit includes determining whether a resistance compensation value violates one or more predetermined values.

6. The voltage source device of claim 1, wherein the circuitry is configured to capture and temporarily store the second voltage at discrete time intervals.

7. The voltage source device of claim 1, wherein the circuitry includes a switch configured to electrically couple a capacitor to the second voltage to sample the second voltage.

8. The voltage source device of claim 1, wherein the circuitry includes:
an analog-to-digital converter configured to convert the sampled second voltage to a digital signal;
a memory configured to store the digital signal representing the second voltage; and
a processor.

9. The voltage source device of claim 1, wherein the circuitry includes a multiplying digital-to-analog converter.

10. A voltage source device, comprising:
a first voltage source configured to output a first voltage;
source pathways to connect the first voltage source to a device under test;
sensing pathways electrically coupled to the device under test; and
circuitry configured to sample a second voltage at the device under test, determine a voltage difference between the first voltage and the second voltage, and adjust the first voltage based on the difference between the first voltage and the second voltage, wherein the circuitry includes:
a voltage detector coupled to the sensing pathways to measure and/or scale a detected value of the second voltage; and
a sample and hold component configured to capture and temporarily store the sampled second voltage.

11. A method for correcting a source device based on a voltage at a device under test, comprising:
generating a first voltage;
transmitting the first voltage to the device under test;
sampling a second voltage at the device under test;
determining a voltage difference between the first voltage and the second voltage;
determining an adjustment voltage based on the voltage difference; and
adjusting the first voltage based on the adjustment voltage, further comprising:
determining whether the adjustment voltage violates a correction limit; and
adjusting the first voltage based on the adjustment voltage when the correction limit is not violated.

12. The method of claim 11, wherein determining whether the adjustment voltage violates the correction limit includes determining whether the adjustment voltage violates one or more predetermined values.

13. The method of claim 12, wherein the adjustment voltage violates the correction limit when the adjustment voltage is greater than a predetermined voltage.

14. The method of claim 11, wherein the adjustment voltage is determined based on a load current and a resistance compensation value that is ascertained by an electrical current through the device under test and the voltage difference.

15. The method of claim 11, wherein determining whether the adjustment voltage violates the correction limit includes determining whether a resistance compensation value violates one or more predetermined values.

16. The method of claim 11, wherein sampling the second voltage at the device under test includes activating a switch to electrically couple a capacitor to the second voltage.

17. The method of claim 11, further comprising:
converting the second voltage to a digital signal representing the second voltage;
storing the digital signal representing the second voltage, and
periodically determining the adjustment voltage based on the stored digital signal representing the second voltage.

18. The method of claim 11, further comprising temporarily storing the second voltage.

* * * * *